(12) United States Patent
Ma et al.

(10) Patent No.: US 9,012,333 B2
(45) Date of Patent: Apr. 21, 2015

(54) VARIED SILICON RICHNESS SILICON NITRIDE FORMATION

(75) Inventors: Yi Ma, Santa Clara, CA (US); Shenqing Fang, Fremont, CA (US); Robert Ogle, San Jose, CA (US)

(73) Assignee: Spansion LLC, Sunnyvale, CA (US)

( * ) Notice: Subject to any disclaimer, the term of this patent is extended or adjusted under 35 U.S.C. 154(b) by 788 days.

(21) Appl. No.: 12/556,199

(22) Filed: Sep. 9, 2009

(65) Prior Publication Data

US 2011/0057248 A1    Mar. 10, 2011

(51) Int. Cl.
*H01L 21/469* (2006.01)
*H01L 21/318* (2006.01)
*H01L 21/02* (2006.01)
*H01L 21/28* (2006.01)
*H01L 21/314* (2006.01)
*H01L 29/423* (2006.01)
*H01L 29/51* (2006.01)

(52) U.S. Cl.
CPC ........ *H01L 21/3185* (2013.01); *H01L 21/0217* (2013.01); *H01L 21/022* (2013.01); *H01L 21/0228* (2013.01); *H01L 21/28282* (2013.01); *H01L 21/3141* (2013.01); *H01L 29/4234* (2013.01); *H01L 29/518* (2013.01)

(58) Field of Classification Search
CPC ............ H01L 29/513; H01L 21/28282; H01L 29/792; H01L 21/3185; H01L 21/28202; H01L 29/42348; H01L 29/2003; H01L 2924/00014; H01L 29/7787; H01L 21/02488; H01L 21/02458; H01L 21/318; H01L 21/0217; H01L 21/022; H01L 21/0228; H01L 21/3141; H01L 29/4234; H01L 29/518
USPC ................. 438/778, 763; 257/324, E21.24, 257/E29.309
See application file for complete search history.

(56) References Cited

U.S. PATENT DOCUMENTS

| | | | |
|---|---|---|---|
| 2006/0183305 A1* | 8/2006 | Gao et al. ........ | 438/514 |
| 2006/0189014 A1* | 8/2006 | Li et al. ............ | 438/28 |
| 2006/0261401 A1* | 11/2006 | Bhattacharyya ... | 257/316 |
| 2007/0128858 A1* | 6/2007 | Haukka et al. .... | 438/656 |
| 2008/0026553 A1* | 1/2008 | Chua et al. ........ | 438/591 |
| 2008/0073724 A1* | 3/2008 | Liang et al. ...... | 257/369 |
| 2008/0093661 A1* | 4/2008 | Joo et al. .......... | 257/324 |
| 2009/0152617 A1* | 6/2009 | Ma et al. ........... | 257/324 |

\* cited by examiner

*Primary Examiner* — Duy T Nguyen

(57) ABSTRACT

A method, in one embodiment, can include forming a tunnel oxide layer on a substrate. In addition, the method can include depositing via atomic layer deposition a first layer of silicon nitride over the tunnel oxide layer. Note that the first layer of silicon nitride includes a first silicon richness. The method can also include depositing via atomic layer deposition a second layer of silicon nitride over the first layer of silicon nitride. The second layer of silicon nitride includes a second silicon richness that is different than the first silicon richness.

20 Claims, 9 Drawing Sheets

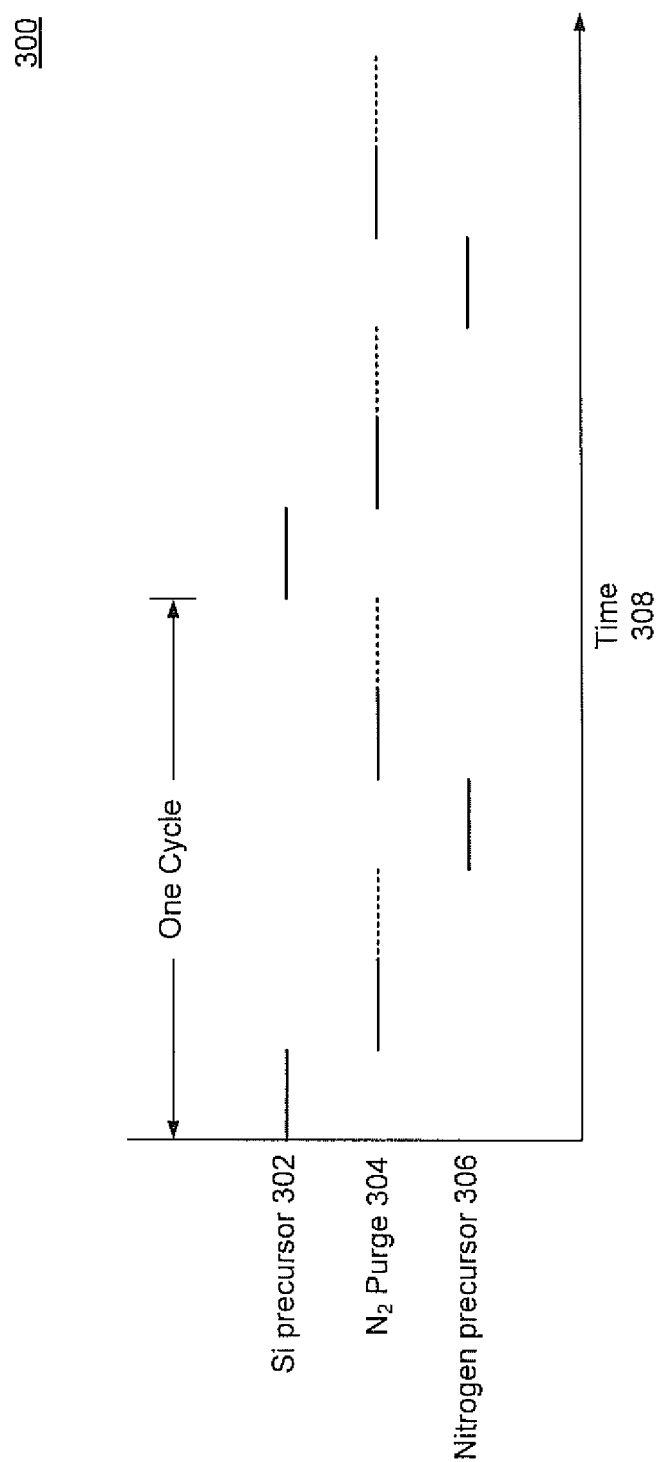

VARIED SILICON RICHNESS SILICON NITRIDE FORMATION

BACKGROUND

Conventional computing devices typically include integrated circuit (IC) memory devices. For example, a computing device may be implemented to include volatile IC memory devices, or non-volatile IC memory devices, or both. It is pointed out that one conventional technique utilized for fabricating IC memory devices is the low pressure chemical vapor deposition (LPCVD) technique. However, when the LPCVD technique is utilized to deposit certain materials as part of fabricating IC memory devices, it may exhibit one or more shortcomings.

SUMMARY

A method, in one embodiment, can include forming a tunnel oxide layer on a substrate. In addition, the method can include depositing via atomic layer deposition a first layer of silicon nitride over the tunnel oxide layer. Note that the first layer of silicon nitride includes a first silicon richness. The method can also include depositing via atomic layer deposition a second layer of silicon nitride over the first layer of silicon nitride. The second layer of silicon nitride includes a second silicon richness that is different than the first silicon richness.

In another embodiment, an integrated circuit memory device can include a substrate and a tunnel oxide layer that is disposed over the substrate. Additionally, a first layer of silicon nitride is disposed over the tunnel oxide layer via atomic layer deposition. The first layer of silicon nitride includes a first silicon richness. A second layer of silicon nitride is disposed over the first layer of silicon nitride via atomic layer deposition. The second layer of silicon nitride includes a second silicon richness that is different than the first silicon richness.

While particular embodiments in accordance with the invention have been specifically described within this Summary, it is noted that the invention and the claimed subject matter are not limited in any way by these embodiments.

BRIEF DESCRIPTION OF THE DRAWINGS

Embodiments of the invention are illustrated by way of example and not by way of limitation in the accompanying drawings and in which like reference numerals refer to similar elements.

FIG. 3 is a chart illustrating an atomic layer deposition (ALD) process in accordance with an embodiment of the invention.

The drawings referred to in this description should not be understood as being drawn to scale except if specifically noted.

DETAILED DESCRIPTION

Reference will now be made in detail to various embodiments in accordance with the invention, examples of which are illustrated in the accompanying drawings. While the invention will be described in conjunction with various embodiments, it will be understood that these various embodiments are not intended to limit the invention. On the contrary, the invention is intended to cover alternatives, modifications and equivalents, which may be included within the scope of the invention as construed according to the Claims. Furthermore, in the following detailed description of various embodiments in accordance with the invention, numerous specific details are set forth in order to provide a thorough understanding of the invention. However, it will be evident to one of ordinary skill in the art that the invention may be practiced without these specific details. In other instances, well known methods, procedures, components, and circuits have not been described in detail as not to unnecessarily obscure aspects of the invention.

Figure 1:
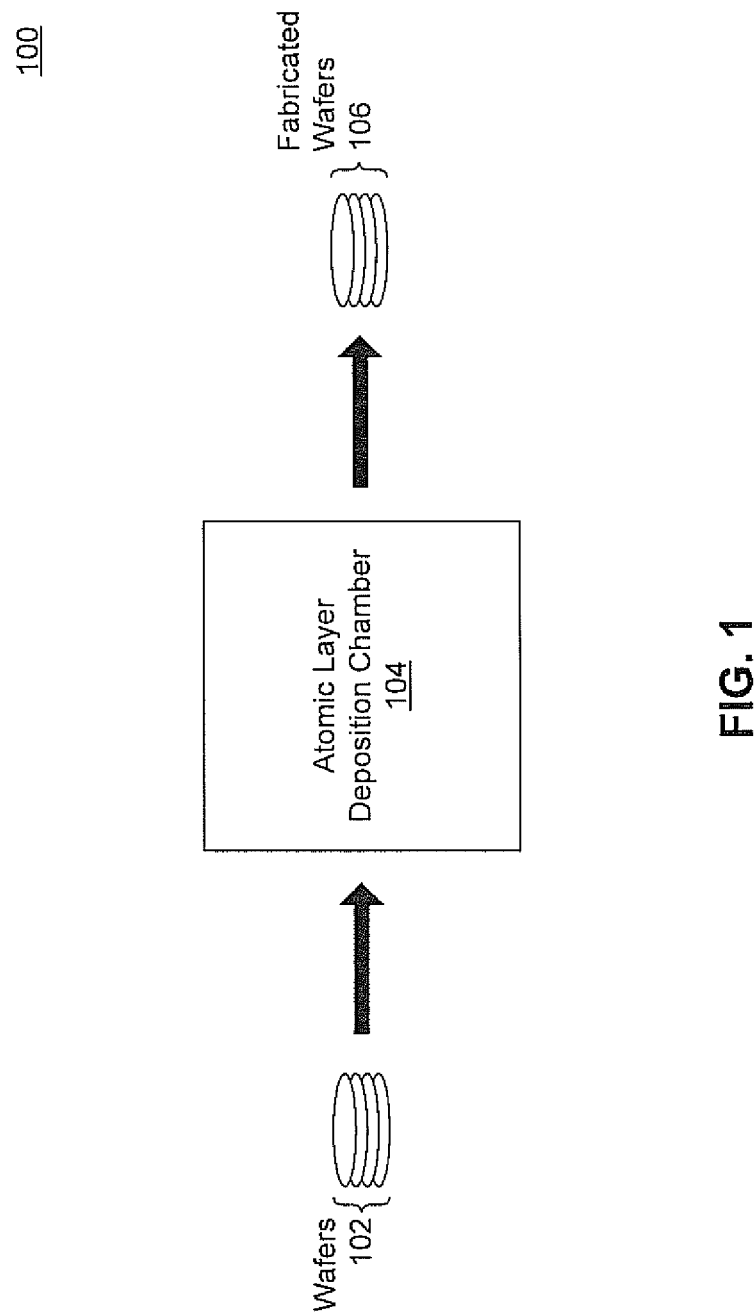
FIG. 1 is an atomic layer deposition (ALD) system which can be utilized in accordance with various embodiments of the invention.

FIG. 1 is an atomic layer deposition (ALD) system 100 which can be utilized in accordance with various embodiments of the invention. The atomic layer deposition system 100 can include an atomic layer deposition chamber 104 that can be utilized to fabricate a wide variety of integrated circuits (IC) onto one or more semiconductor substrates 102 (e.g., semiconductor wafers). For example in one embodiment, the atomic layer deposition chamber 104 can be utilized to fabricate non-volatile memory devices, which can include flash memory, NOR-type flash memory, NAND-type flash memory, read-only memory (ROM), Electrically Erasable Programmable Read-Only Memory (EEPROM), and the like. In an embodiment, as part of fabricating or forming integrated circuit (e.g., non-volatile memory devices) onto the one or more semiconductor substrates 102, the atomic layer deposition chamber 104 can be utilized to deposit or form thereon one or more varied silicon richness silicon nitride films or layers.

Specifically, in one embodiment, one or more semiconductor wafers 102 can be put into the atomic layer deposition chamber 104 in order to fabricate integrated circuits thereon. It is noted that the one or more semiconductor wafers 102 can be implemented in a wide variety of ways. For example, the one or more semiconductor wafers 102 can be implemented with any semiconductor material, such as but not limited to, silicon crystal. In one embodiment, in order to form one or more varied silicon richness silicon nitride films onto one or more substrates such as semiconductor wafers 102, the atomic layer deposition chamber 104 can be equipped with, but is not limited to, a silane ($SiH_4$) precursor, an ammonia ($NH_3$) precursor, and a silicon precursor that are reactive within the temperature range of approximately 400-900 degrees Celsius (C). In addition, the atomic layer deposition chamber 104 can be further equipped with, but is not limited to, argon (Ar), molecular nitrogen ($N_2$), and a nitrogen precursor. Furthermore, it is pointed out that the atomic layer deposition chamber 104 can be equipped in an embodiment such that the gas flow of each precursor and gas can be independently switched on and off in a matter of seconds, but is not limited to such. After the fabrication process of integrated circuits in accordance with one or more embodiments of the invention, the one or more fabricated wafers 106 that include integrated circuits can be removed from the atomic layer deposition chamber 104. It is pointed out that the fabrication operations of the integrated circuits onto the one or more semiconductor wafers 102 can be completed in-situ.

Figure 2A:
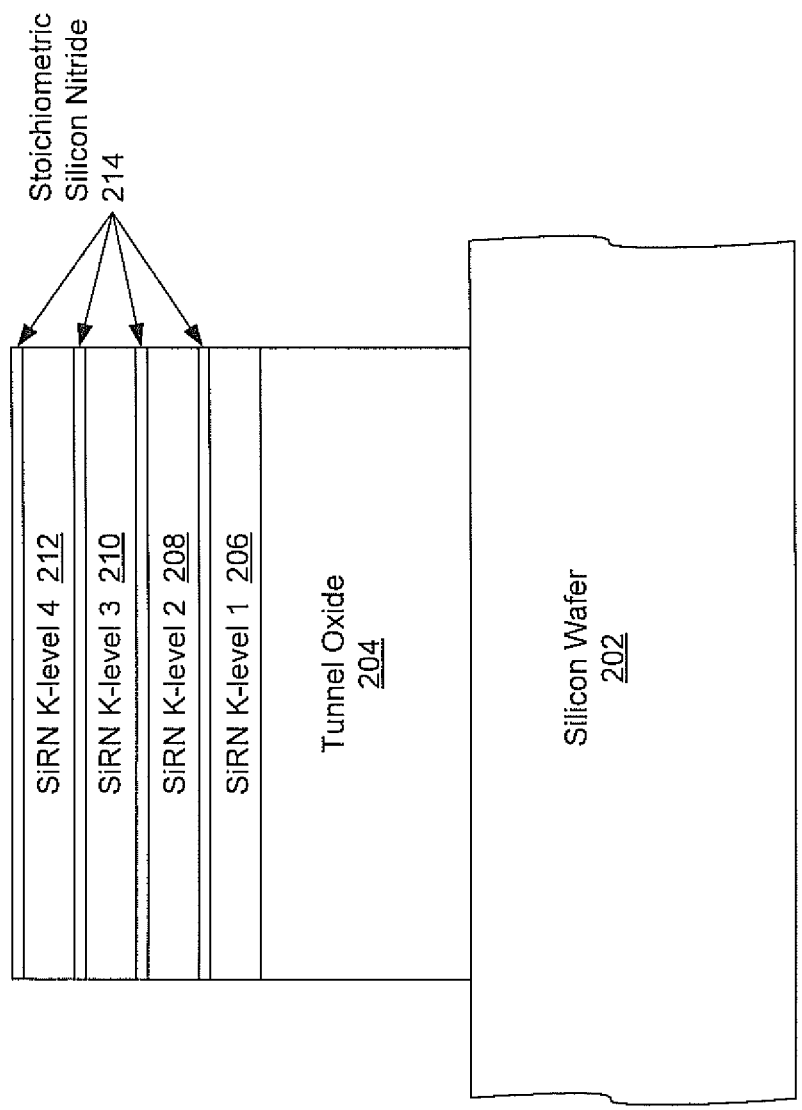
FIG. 2A is a side sectional view of an integrated circuit (IC) memory device in accordance with an embodiment of the invention.

FIG. 2A illustrates a side sectional view of an integrated circuit (IC) memory device 200 in accordance with an embodiment of the invention. It is noted that the integrated circuit memory device 200 can be fabricated utilizing the atomic layer deposition chamber 104 (FIG. 1). For example in one embodiment, a semiconductor substrate (e.g., silicon wafer) 202 can be loaded or placed into the atomic layer deposition chamber 104 in order to fabricate integrated circuits (e.g., non-volatile memory devices) that include one or more varied silicon richness silicon nitride films or layers. In an embodiment, a thin tunnel oxide layer 204 can be formed onto (or over or above) the silicon wafer 202. After that, the atomic layer deposition chamber 104 can deposit onto (or over or above) the tunnel oxide layer 204 a silicon nitride film or layer 206 having a desired silicon richness. It is pointed out that the silicon nitride film 206 can be deposited via atomic layer deposition with any type of silicon richness. For example in one embodiment, the silicon nitride film or layer 206 can be deposited having a silicon richness ranging from one extreme of almost 100% silicon with the remaining percentage being nitride to the other extreme of almost 100% nitride with the remaining percentage being silicon, and anywhere in between. Furthermore, in an embodiment, the silicon nitride film or layer 206 can be deposited having a silicon richness of k~1.6 (wherein k is the extinction coefficient at a wavelength of 248 nanometers (nm)), but is not limited to such. In addition, note that the silicon nitride film 206 can be deposited to include an upper layer or film of stoichiometric silicon nitride 214, but is not limited to such. Furthermore, the silicon nitride film 206 can be deposited at any thickness. For example in an embodiment, the silicon nitride film 206 can be deposited to have a thickness of approximately 2-10 angstroms (or approximately 0.2-1 nm), but is not limited to such.

Next, in one embodiment, the atomic layer deposition chamber 104 can deposit onto (or over or above) the silicon nitride film 206 a silicon nitride film or layer 208 having a different silicon richness than the silicon nitride film 206. It is pointed out that the silicon nitride film 208 can be deposited via atomic layer deposition with any type of silicon richness that is greater than or less than the silicon richness of the previous silicon nitride layer 206. For example in an embodiment, the silicon nitride film or layer 208 can be deposited having a silicon richness of k~1.4 or ~1.7, but is not limited to such. Additionally, the silicon nitride film 208 can be deposited to include an upper layer or film of stoichiometric silicon nitride 214, but is not limited to such. Moreover, the silicon nitride film 208 can be deposited at any thickness. For example in an embodiment, the silicon nitride film 208 can be deposited to a thickness of approximately 2-10 angstroms (or approximately 0.2-1 nm), but is not limited to such.

Referring still to FIGS. 1 and 2A, in an embodiment, the atomic layer deposition chamber 104 can deposit onto (or over or above) the silicon nitride film 208 a silicon nitride film or layer 210 having a different silicon richness than the silicon nitride film 208. Note that the silicon nitride film 210 can be deposited via atomic layer deposition with any type of silicon richness that is greater than or less than the silicon richness of the previous silicon nitride layer 208. For example in one embodiment, the silicon nitride film or layer 210 can be deposited having a silicon richness of k~1.2 or ~1.6, but is not limited to such. Furthermore, the silicon nitride film 210 can be deposited to include an upper layer or film of stoichiometric silicon nitride 214, but is not limited to such. In addition, the silicon nitride film 210 can be deposited at any thickness. For example in an embodiment, the silicon nitride film 210 can be deposited to a thickness of approximately 2-10 angstroms (or approximately 0.2-1 nm), but is not limited to such.

Next, in one embodiment, the atomic layer deposition chamber 104 can deposit onto (or over or above) the silicon nitride film 210 a silicon nitride film or layer 212 having a different silicon richness than the silicon nitride film 210. Note that the silicon nitride film 212 can be deposited via atomic layer deposition with any type of silicon richness that is greater than or less than the silicon richness of the previous silicon nitride layer 210. For example in one embodiment, the silicon nitride film or layer 212 can be deposited having a silicon richness of k~1 or ~1.8, but is not limited to such. Additionally, the silicon nitride film 212 can be deposited to include an upper layer or film of stoichiometric silicon nitride 214, but is not limited to such. Moreover, the silicon nitride film 212 can be deposited at any thickness. For example, in an embodiment, the silicon nitride film 212 can be deposited to a thickness of approximately 2-10 angstroms (or approximately 0.2-1 nm), but is not limited to such. In this manner, the integrated circuit memory device 200 can be fabricated utilizing the atomic layer deposition chamber 104 to include varied or variable silicon richness silicon nitride films or layers 206, 208, 210, and 212. It is pointed out that in various embodiments, the integrated circuit memory device 200 can be fabricated in a manner similar to that described with reference to FIGS. 1 and 2A to include a greater or lesser number of varied or variable silicon richness silicon nitride films or layers than the four that are shown.

Referring to FIGS. 1 and 2A, it is pointed out that the above described fabrication processes in accordance with embodiments of the invention can provide potential benefits. For example in one embodiment, the atomic layer deposition chamber 104 together with the above described fabrication processes can precisely engineer or control the silicon richness variation and thickness of each silicon nitride layer (e.g., 206, 208, 210, or 212) to meet desired device performance. In addition, the atomic layer deposition chamber 104 together with the above described fabrication processes can have the capability to achieve extremely higher silicon richness within each silicon nitride layer (e.g., 206, 208, 210, or 212) than the conventional LPCVD (Low Pressure Chemical Vapor Deposition) technique. Furthermore, the atomic layer deposition chamber 104 together with the above described fabrication processes can produce each silicon nitride layer (e.g., 206, 208, 210, or 212) having smoother film surface roughness than those formed with the conventional LPCVD technique. Moreover, the above described fabrication processes can enable enhanced program and erase speed in non-volatile memory (e.g., multi-level cell devices). Additionally, the above described fabrication processes can enable enhanced non-volatile memory device endurance characteristics. In addition, the above described fabrication processes can change erase characteristics of non-volatile memory devices, programming characteristics of non-volatile memory devices, and data retention characteristics of non-volatile memory devices. It is pointed out that the above described fabrication processes are not limited in any way by these potential benefits.

Figure 2B:
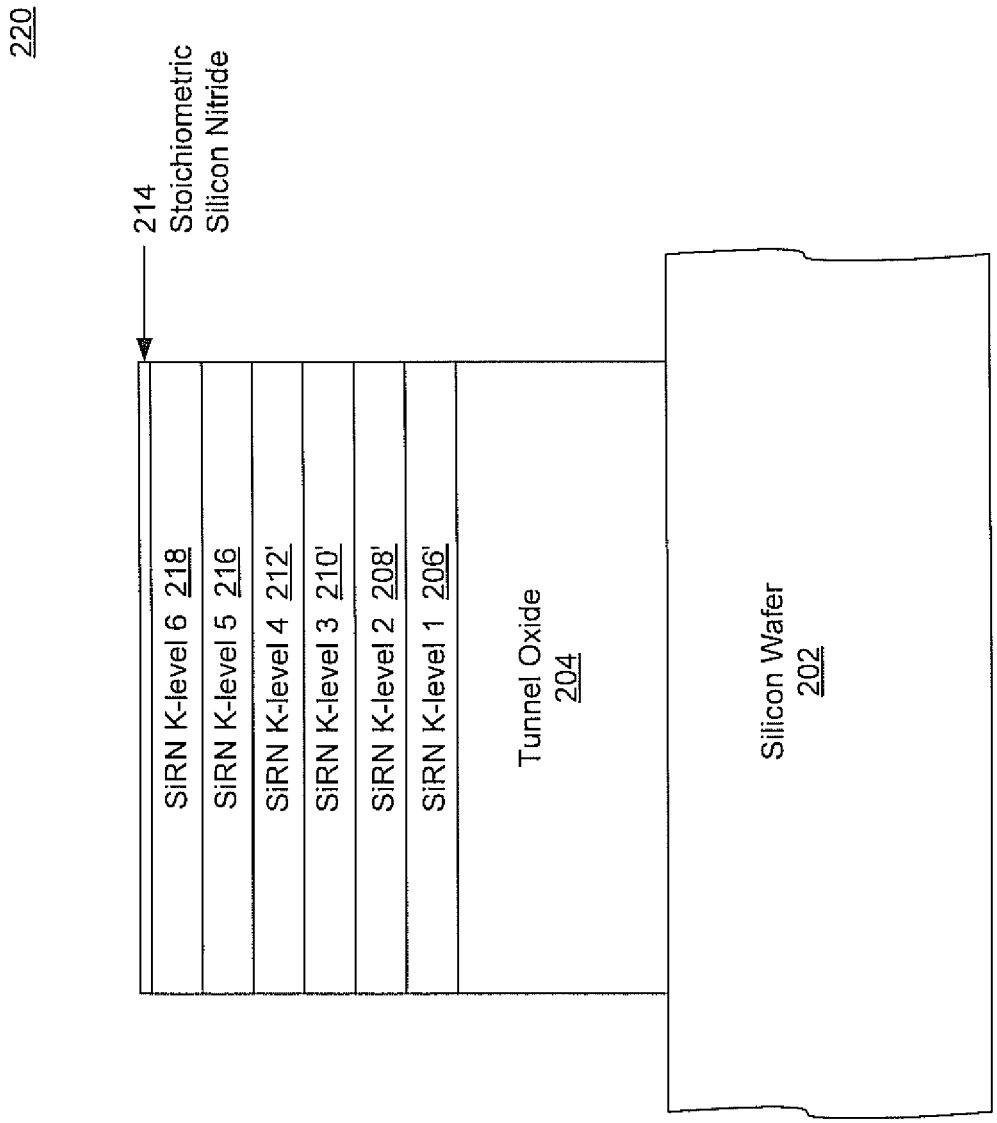
FIG. 2B is a side sectional view of an integrated circuit (IC) memory device in accordance with one embodiments of the invention.

FIG. 2B illustrates a side sectional view of an integrated circuit (IC) memory device 220 in accordance with one embodiment of the invention. Note that the integrated circuit memory device 220 can be fabricated utilizing the atomic layer deposition chamber 104 (FIG. 1). For example in one embodiment, a semiconductor substrate (e.g., silicon wafer) 202 can be placed or loaded into the atomic layer deposition chamber 104 in order to fabricate integrated circuits (e.g., non-volatile memory devices) that include one or more varied silicon richness silicon nitride films or layers. In one embodiment, a thin tunnel oxide layer 204 can be formed onto (or over or above) the silicon wafer 202. Next, the atomic layer deposition chamber 104 can deposit onto (or over or above) the tunnel oxide layer 204 a silicon nitride film or layer 206' having a desired silicon richness. It is noted that the silicon nitride film 206' can be deposited via atomic layer deposition with any type of silicon richness. For example in one embodiment, the silicon nitride film or layer 206' can be deposited having a silicon richness ranging from one extreme of almost 100% silicon with the remaining percentage being nitride to the other extreme of almost 100% nitride with the remaining percentage being silicon, and anywhere in between. Additionally, in one embodiment, the silicon nitride film or layer 206' can be deposited having a silicon richness of k~1.6 (wherein k is the extinction coefficient at a wavelength of 248 nanometers (nm)), but is not limited to such. In addition, note that the silicon nitride film 206' can be deposited at any thickness. For example in one embodiment, the silicon nitride film 206' can be deposited to have a thickness of approximately 2-10 angstroms (or approximately 0.2-1 nm), but is not limited to such.

Next, in an embodiment, the atomic layer deposition chamber 104 can deposit onto (or over or above) the silicon nitride film 206' a silicon nitride film or layer 208' having a different silicon richness than the silicon nitride film 206'. Note that the silicon nitride film 208' can be deposited via atomic layer deposition with any type of silicon richness that is greater than or less than the silicon richness of the previous silicon nitride layer 206'. For example in one embodiment, the silicon nitride film or layer 208' can be deposited having a silicon richness of k~1.4 or ~1.8, but is not limited to such. Furthermore, the silicon nitride film 208' can be deposited at any thickness. For example in an embodiment, the silicon nitride film 208' can be deposited to a thickness of approximately 2-10 angstroms (or approximately 0.2-1 nm), but is not limited to such.

Referring still to FIGS. 1 and 2B, in one embodiment, the atomic layer deposition chamber 104 can deposit onto (or over or above) the silicon nitride film 208' a silicon nitride film or layer 210' having a different silicon richness than the silicon nitride film 208'. The silicon nitride film 210' can be deposited via atomic layer deposition with any type of silicon richness that is greater than or less than the silicon richness of the previous silicon nitride layer 208'. For example in an embodiment, the silicon nitride film or layer 210' can be deposited having a silicon richness of k~1.2 or ~1.9, but is not limited to such. In addition, the silicon nitride film 210' can be deposited at any thickness. For example in an embodiment, the silicon nitride film 210' can be deposited to a thickness of approximately 2-10 angstroms (or approximately 0.2-1 nm), but is not limited to such.

Next, in one embodiment, the atomic layer deposition chamber 104 can deposit onto (or over or above) the silicon nitride film 210' a silicon nitride film or layer 212' having a different silicon richness than the silicon nitride film 210'. It is noted that the silicon nitride film 212' can be deposited via atomic layer deposition with any type of silicon richness that is greater than or less than the silicon richness of the previous silicon nitride layer 210'. For example in an embodiment, the silicon nitride film or layer 212' can be deposited having a silicon richness of k~1 or ~1.3, but is not limited to such. In addition, the silicon nitride film 212' can be deposited at any thickness. For example in one embodiment, the silicon nitride film 212' can be deposited to a thickness of approximately 2-10 angstroms (or approximately 0.2-1 nm), but is not limited to such.

Referring still to FIGS. 1 and 2B, in an embodiment, the atomic layer deposition chamber 104 can deposit onto (or over or above) the silicon nitride film 212' a silicon nitride film or layer 216 having a different silicon richness than the silicon nitride film 212'. The silicon nitride film 216 can be deposited via atomic layer deposition with any type of silicon richness that is greater than or less than the silicon richness of the previous silicon nitride layer 212'. For example in one embodiment, the silicon nitride film or layer 216 can be deposited having a silicon richness of k~0.9 or ~1.5, but is not limited to such. Additionally, the silicon nitride film 216 can be deposited at any thickness. For example in an embodiment, the silicon nitride film 216 can be deposited to a thickness of approximately 2-10 angstroms (or approximately 0.2-1 nm), but is not limited to such.

Next, in an embodiment, the atomic layer deposition chamber 104 can deposit onto (or over or above) the silicon nitride film 216 a silicon nitride film or layer 218 having a different silicon richness than the silicon nitride film 216. It is noted that the silicon nitride film 218 can be deposited via atomic layer deposition with any type of silicon richness that is greater than or less than the silicon richness of the previous silicon nitride layer 216. For example in one embodiment, the silicon nitride film or layer 218 can be deposited having a silicon richness of k~0.8 or ~1.2, but is not limited to such. Furthermore, the silicon nitride film 218 can be deposited to include an upper layer or film of stoichiometric silicon nitride 214. Moreover, the silicon nitride film 218 can be deposited at any thickness. For example, in an embodiment, the silicon nitride film 218 can be deposited to a thickness of approximately 2-10 angstroms (or approximately 0.2-1 nm), but is not limited to such. In this manner, integrated circuit memory device 220 can be fabricated utilizing the atomic layer deposition chamber 104 to include varied or variable silicon richness silicon nitride films or layers 206', 208', 210', 212', 216, and 218. It is pointed out that in various embodiments, the integrated circuit memory device 220 can be fabricated in a manner similar to that described with reference to FIGS. 1 and 2B to include a greater or lesser number of varied or variable silicon richness silicon nitride films or layers than the six that are shown. For example in one embodiment, one or more additional layers could have been fabricated between, but are not limited to, the silicon nitride layer 218 and the upper layer or film of stoichiometric silicon nitride 214.

Referring to FIGS. 1 and 2B, it is pointed out that the above described fabrication processes in accordance with embodiments of the invention can provide potential benefits. For example in one embodiment, the atomic layer deposition chamber 104 together with the above described fabrication processes described with reference to FIGS. 1 and 2B can produce potential benefits similar to those described above with reference to FIGS. 1 and 2A, but are not limited to such. It is noted that the above described fabrication processes described with reference to FIGS. 1 and 2B are not limited in any way by those potential benefits.

FIG. 3 is a chart 300 illustrating an atomic layer deposition (ALD) process in accordance with an embodiment of the invention. Specifically, the chart 300 illustrates one embodiment of an atomic layer deposition process for depositing one or more varied or variable silicon richness silicon nitride layers (e.g., 206, 206', 208, 208', 210, 210', and 212) onto one or more semiconductor substrates (e.g., 102). It is noted that the graph 300 illustrates that a single cycle for the atomic layer deposition process can include four separate operations that involve using a silicon (Si) precursor 302, a molecular nitrogen ($N_2$) purge 304, and a nitrogen precursor 306. Note that in one embodiment, the silicon precursor 302 can be reactive at a temperature range of approximately 400-900 degrees Celsius, but are not limited to such. It is pointed out that the X-axis of the chart 300 represents the progression of time 308, but does not include any type of scale.

More specifically, in one embodiment, after a semiconductor substrate (e.g., 102) has been put or loaded into an atomic layer deposition chamber (e.g., 104) and a tunnel oxide layer (e.g., 204) has been formed thereon, the chart 300 indicates that the first operation can include injecting the silicon precursor 302 into the chamber for approximately a sixth of the cycle in order to deposit it onto the tunnel oxide layer. Next, the chart 300 indicates that the second operation can include the atomic layer deposition chamber (e.g., 104) performing a molecular nitrogen purge 304 of the chamber for approximately a third of the cycle in order to remove anything remaining from the previous injection of the silicon precursor 302. After that, the chart 300 indicates that the third operation can include injecting the nitrogen precursor 306 into the atomic deposition chamber for approximately a sixth of the cycle in order to deposit it onto the previously deposited silicon precursor 302 and the tunnel oxide layer. Next, the chart 300 indicates that the fourth operation can include the atomic layer deposition chamber (e.g., 104) performing the molecular nitrogen purge 304 of the chamber for approximately a third of the cycle in order to remove anything remaining from the previous injection of the nitrogen precursor 306. It is pointed out that the above described cycle of four operations can be continually repeated in order to deposit a layer of silicon nitride to a desirable thickness that has a desired silicon richness. As such, the chart 300 illustrates one embodiment of an atomic layer deposition process that can be utilized for depositing one or more varied or variable silicon richness silicon nitride layers onto one or more semiconductor wafers.

Figure 4:
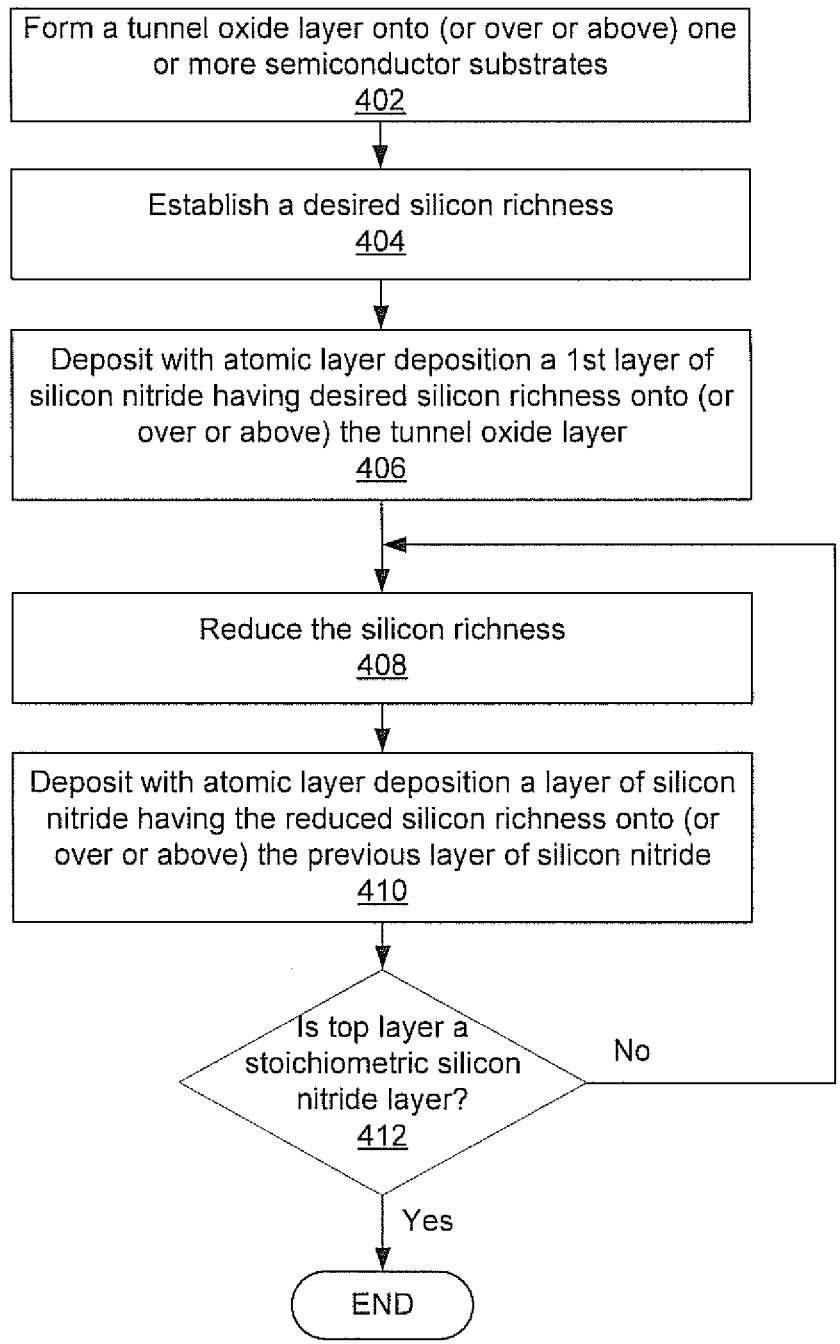
FIG. 4 is a flow diagram of a method in accordance with an embodiment of the invention.

FIG. 4 is a flow diagram of an example method 400 in accordance with various embodiments of the invention for producing integrated circuits (e.g., non-volatile memory devices) that include varied silicon richness silicon nitride layers. Although specific operations are disclosed in flow diagram 400, such operations are examples. Method 400 may not include all of the operations illustrated by FIG. 4. Also, method 400 may include various other operations and/or variations of the operations shown by FIG. 4. Likewise, the sequence of the operations of flow diagram 400 can be modified. It is appreciated that not all of the operations in flow diagram 400 may be performed.

Specifically, method 400 can include forming a tunnel oxide layer onto (or over or above) one or more semiconductor substrates. Additionally, a desired silicon richness value can be predefined or pre-establish for a first silicon nitride layer to be deposited onto (or over or above) the tunnel oxide layer. Utilizing atomic layer deposition, a first layer of silicon nitride having the desired silicon richness value can be deposited onto (or over or above) the tunnel oxide layer. In addition, a reduction can be made to the silicon richness value. Furthermore, utilizing atomic layer deposition, an additional layer of silicon nitride having the reduced silicon richness value can be deposited onto (or over or above) the previous layer of silicon nitride. A determination can be made as to whether the top layer of silicon nitride is a stoichiometric silicon nitride layer. If not, process 400 can return to the operation involving the reduction of the silicon richness value. However, if it is determined that the top layer of silicon nitride is a stoichiometric silicon nitride layer, process 400 can be ended.

Figure 5A:
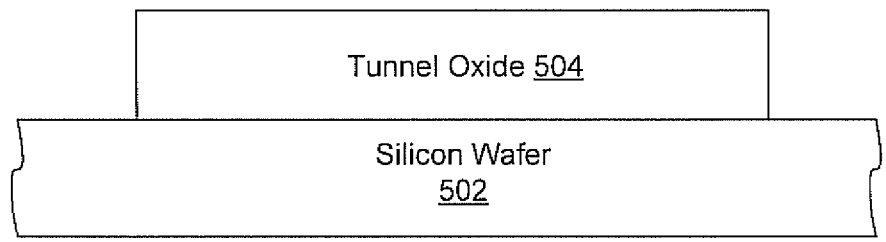
FIGS. 5A-5D show various stages during fabrication of an IC memory device in accordance with various embodiments of the invention.

At operation 402 of FIG. 4, a tunnel oxide layer (e.g., 204) can be formed onto (or over or above) one or more semiconductor substrates (e.g., 102). It is pointed out that operation 402 can be implemented in a wide variety of ways. For example in one embodiment, FIG. 5A is a side sectional view of a tunnel oxide layer 504 formed onto (or over or above) a silicon wafer 502 at operation 402. In an embodiment, the forming of the tunnel oxide layer 504 onto (or over or above) the silicon wafer 502 at operation 402 can be performed using atomic layer deposition, but is not limited to such. Furthermore, it is noted that the tunnel oxide layer 504 can be formed or deposited at any thickness at operation 402. Note that operation 402 can be implemented in any manner similar to that described herein, but is not limited to such.

At operation 404, a desired silicon richness value can be predefined or pre-establish for a first silicon nitride layer to be deposited onto (or over or above) the tunnel oxide layer. It is noted that the operation 404 can be implemented in a wide variety of ways. For example in one embodiment, at operation 404 a desired silicon richness value can be predefined at a silicon richness ranging from one extreme of almost 100% silicon with the remaining percentage being nitride to the other extreme of almost 100% nitride with the remaining percentage being silicon, and anywhere in between. In addition, in an embodiment, at operation 404 a desired silicon richness value can be predefined at a silicon richness of k~1.6 (wherein k is the extinction coefficient at a wavelength of 248 nm), but is not limited to such. However, the desired silicon richness value can be predefined at any type of silicon richness at operation 404. It is noted that operation 404 can be implemented in any manner similar to that described herein, but is not limited to such.

Figure 5B:
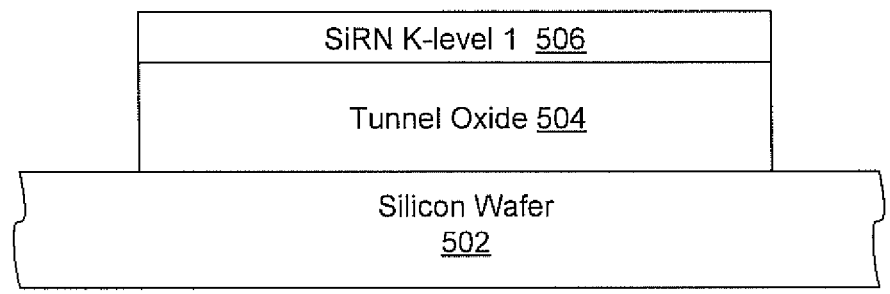

At operation 406 of FIG. 4, utilizing atomic layer deposition, a first layer of silicon nitride (e.g., 206') having the desired silicon richness value can be deposited onto (or over or above) the tunnel oxide layer. Note that the operation 406 can be implemented in a wide variety of ways. For example in an embodiment, FIG. 5B is a side sectional view of a first layer of silicon nitride 506 having the desired silicon richness value deposited via atomic layer deposition onto (or over or above) the tunnel oxide layer 504 at operation 406. Furthermore, it is noted that the silicon nitride layer or film 506 can be deposited at any thickness at operation 406. For example in one embodiment, the silicon nitride layer 506 can be deposited at operation 406 to have a thickness of approximately 2-10 angstroms (or approximately 0.2-1 nm), but is not limited to such. It is noted that operation 406 can be implemented in any manner similar to that described herein, but is not limited to such.

At operation 408, a reduction can be made to the silicon richness value. It is pointed out that the operation 408 can be implemented in a wide variety of ways. For example in one embodiment, the silicon richness value can be reduced by a predefined amount, but is not limited to such. Additionally, in one embodiment, the silicon richness value can be reduced at operation 408 to have a silicon richness of k~1.4, but is not limited to such. However, the silicon richness value can be reduced at operation 408 to have any type of silicon richness. Note that operation 408 can be implemented in any manner similar to that described herein, but is not limited to such.

Figure 5C:
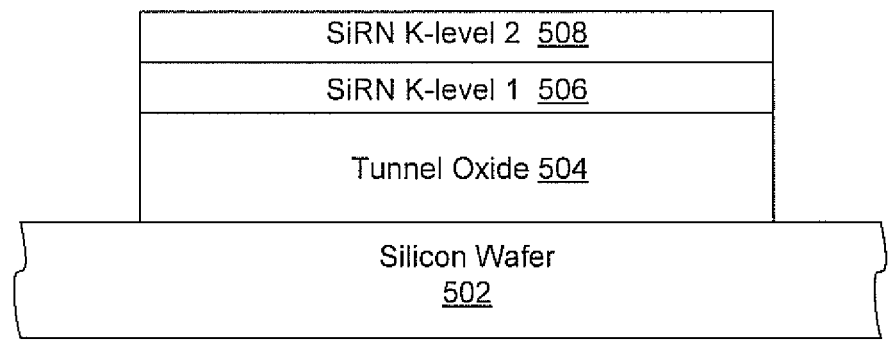

At operation 410 of FIG. 4, utilizing atomic layer deposition, an additional layer of silicon nitride having the reduced silicon richness value can be deposited onto (or over or above)

the previous layer of silicon nitride. It is noted that the operation 410 can be implemented in a wide variety of ways. For example in one embodiment, FIG. 5C is a side sectional view of an additional layer of silicon nitride 508 having the reduced silicon richness value deposited at operation 410 via atomic layer deposition onto (or over or above) the previous silicon nitride layer 506. It is noted that the silicon nitride film 508 can be deposited at operation 410 to any thickness at operation 410. For example in one embodiment, the silicon nitride film 508 can be deposited at operation 410 to have a thickness of approximately 2-10 angstroms (or approximately 0.2-1 nm), but is not limited to such. It is pointed out that operation 410 can be implemented in any manner similar to that described herein, but is not limited to such.

Figure 5D:
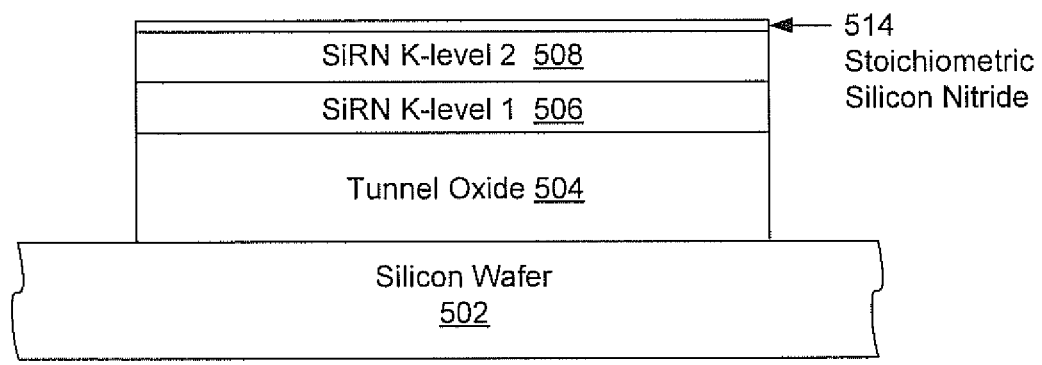

At operation 412, a determination can be made as to whether the top layer of silicon nitride is a stoichiometric silicon nitride layer (e.g., as shown by stoichiometric silicon nitride layer 514 of FIG. 5D). If not, process 400 can proceed to the beginning of operation 408. However, if it is determined at operation 412 that the top layer of silicon nitride is a stoichiometric silicon nitride layer (e.g., 514 of FIG. 5D), process 400 can be ended. Note that the operation 412 can be implemented in a wide variety of ways. For example, operation 412 can be implemented in any manner similar to that described herein, but is not limited to such.

In accordance with the above description, method 400 can produce integrated circuits (e.g., non-volatile memory devices) that include varied silicon richness silicon nitride layers. It is noted that method 400 may produce one or more potential benefits similar to those described herein, but is not limited to such. In addition, method 400 is not limited in any way by those potential benefits.

Figure 6:
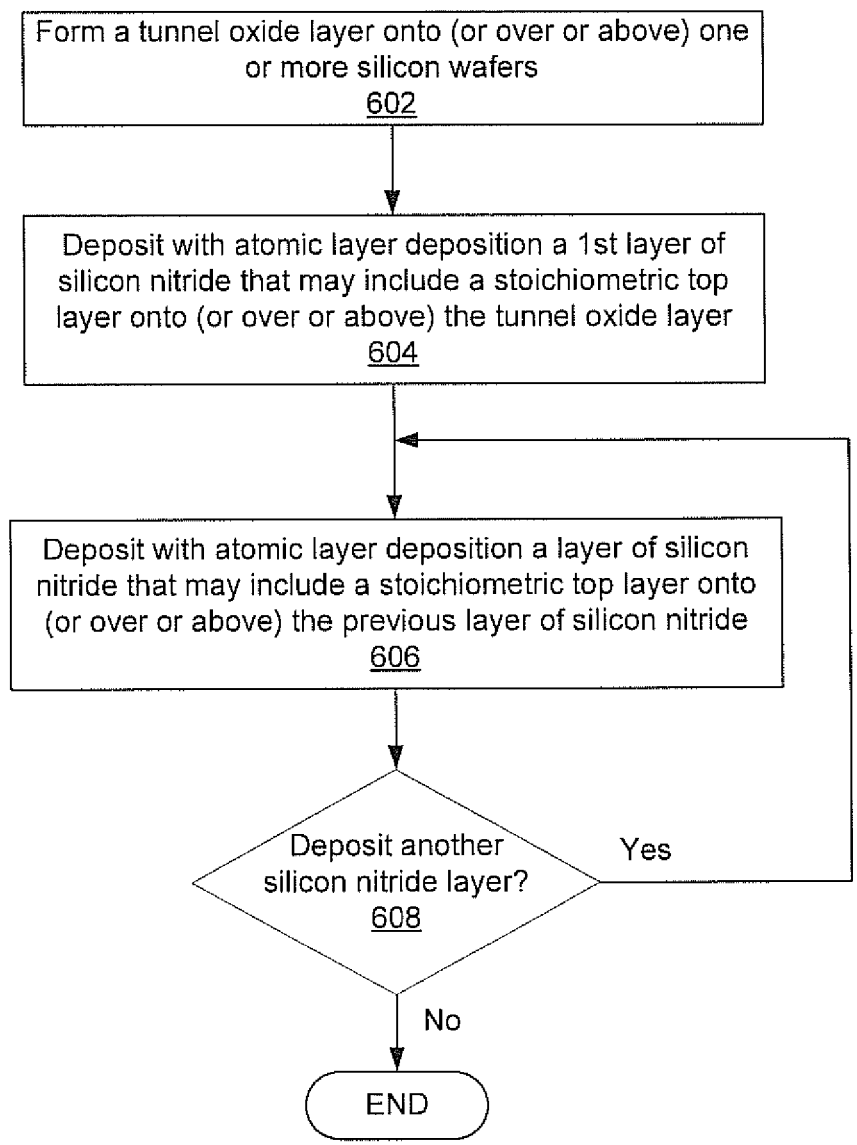
FIG. 6 is a flow diagram of another method in accordance with one embodiment of the invention.

FIG. 6 is a flow diagram of an example method 600 in accordance with various embodiments of the invention for producing integrated circuits (e.g., non-volatile memory devices) that include varied silicon richness silicon nitride layers. Although specific operations are disclosed in flow diagram 600, such operations are examples. Method 600 may not include all of the operations illustrated by FIG. 6. Also, method 600 may include various other operations and/or variations of the operations shown by FIG. 6. Likewise, the sequence of the operations of flow diagram 600 can be modified. It is appreciated that not all of the operations in flow diagram 600 may be performed.

Specifically, method 600 can include forming a tunnel oxide layer onto (or over or above) one or more semiconductor substrates. Additionally, using atomic layer deposition, a first layer of silicon nitride having a first silicon richness value can be deposited onto (or over or above) the tunnel oxide layer. Furthermore, utilizing atomic layer deposition, an additional layer of silicon nitride having a different silicon richness value than the previous silicon nitride layer can be deposited onto (or over or above) the previous layer of silicon nitride. A determination can be made as to whether to deposit another silicon nitride layer. If so, process 600 can return to the operation involving the deposition of an additional silicon nitride layer. However, if it is determined that no more silicon nitride layers are to be deposited, process 600 can be ended.

Figure 7A:
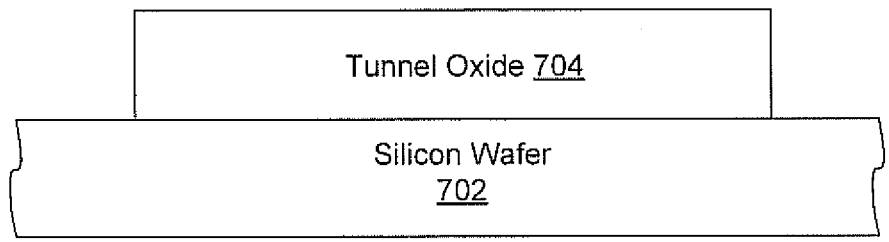
FIGS. 7A-7C show various stages during fabrication of an IC memory device in accordance with various embodiments of the invention.

At operation 602 of FIG. 6, a tunnel oxide layer (e.g., 204) can be formed onto (or over or above) one or more semiconductor substrates (e.g., 102). It is pointed out that the operation 602 can be implemented in a wide variety of ways. For example in an embodiment, FIG. 7A is a side sectional view of a tunnel oxide layer 704 formed onto (or over or above) a semiconductor wafer 702 at operation 602. In one embodiment, the forming of the tunnel oxide layer 704 onto (or over or above) the semiconductor wafer 702 at operation 602 can be performed using atomic layer deposition, but is not limited to such. Furthermore, it is noted that the tunnel oxide layer 704 can be formed or deposited at operation 602 to any thickness. It is noted that operation 602 can be implemented in any manner similar to that described herein, but is not limited to such.

Figure 7B:
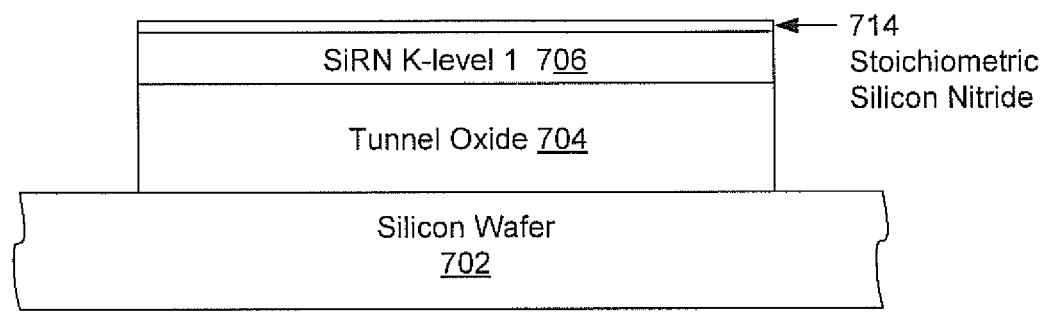

At operation 604, using atomic layer deposition, a first layer of silicon nitride (e.g., 206) having a first silicon richness can be deposited onto (or over or above) the tunnel oxide layer. It is noted that the operation 604 can be implemented in a wide variety of ways. For example in one embodiment, FIG. 7B is a side sectional view of a first layer of silicon nitride 706 having a first silicon richness deposited at operation 604 via atomic layer deposition onto (or over or above) the tunnel oxide layer 704. In an embodiment, the silicon nitride film or layer 706 can have a silicon richness of k~1.6 (wherein k is the extinction coefficient at a wavelength of 248 nm) at operation 604, but is not limited to such. However, the silicon nitride film 706 can be deposited at operation 604 via atomic layer deposition with any type of silicon richness. For example in one embodiment, the silicon nitride film 706 can be deposited at operation 604 via atomic layer deposition with a silicon richness ranging from one extreme of almost 100% silicon with the remaining percentage being nitride to the other extreme of almost 100% nitride with the remaining percentage being silicon, and anywhere in between. Note that in an embodiment, the first layer of silicon nitride 706 can be deposited at operation 604 to include an upper film or layer of stoichiometric silicon nitride 714, but is not limited to such. Furthermore, it is noted that the silicon nitride film 706 can be deposited at operation 604 to any thickness. For example in one embodiment, the silicon nitride film 706 can be deposited at operation 604 to have a thickness of approximately 2-10 angstroms (or approximately 0.2-1 nm), but is not limited to such. It is noted that operation 604 can be implemented in any manner similar to that described herein, but is not limited to such.

Figure 7C:
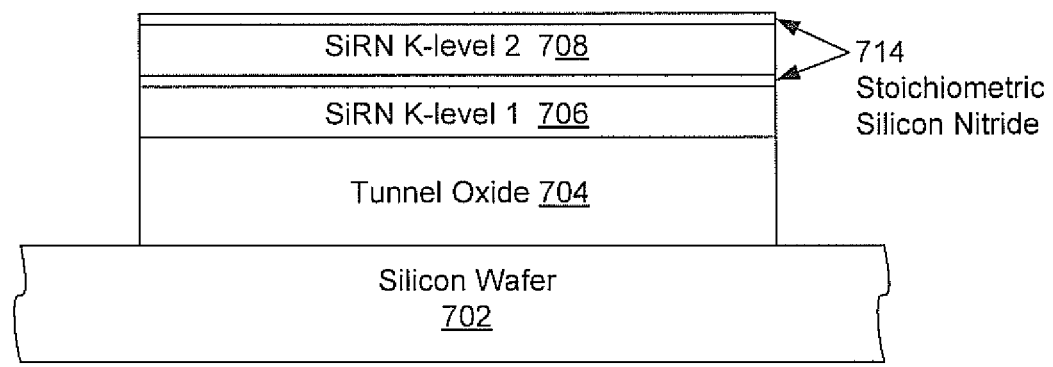

At operation 606 of FIG. 6, utilizing atomic layer deposition, an additional layer of silicon nitride having a different silicon richness value than the previous silicon nitride layer can be deposited onto (or over or above) the previous layer of silicon nitride. Note that the operation 606 can be implemented in a wide variety of ways. For example in one embodiment, FIG. 7C is a side sectional view of an additional layer of silicon nitride 708 having a different silicon richness value than the previous silicon nitride layer deposited at operation 606 via atomic layer deposition onto (or over or above) the previous silicon nitride layer 706. In one embodiment, the silicon nitride film or layer 708 can have a silicon richness of k~1.4 or ~1.7 at operation 606, but is not limited to such. Note that in an embodiment, the silicon nitride film 708 can be deposited at operation 606 via atomic layer deposition with a silicon richness value that is greater than or less than the silicon richness value of the previously deposited silicon nitride layer 706. In one embodiment, the additional layer of silicon nitride 708 can be deposited at operation 606 to include an upper film or layer of stoichiometric silicon nitride 714, but is not limited to such. In addition, it is noted that the silicon nitride film 708 can be deposited at operation 606 to any thickness. For example in one embodiment, the silicon nitride film 708 can be deposited at operation 606 to have a thickness of approximately 2-10 angstroms (or approximately 0.2-1 nm), but is not limited to such. It is pointed out that operation 606 can be implemented in any manner similar to that described herein, but is not limited to such.

At operation 608, a determination can be made as to whether to deposit another silicon nitride layer onto (or over or above) the previous layer of silicon nitride. If so, process 600 can proceed to the beginning of operation 606. However, if it is determined at operation 608 that no more silicon nitride layers are to be deposited, process 600 can be ended. Note that the operation 608 can be implemented in a wide variety of ways. For example, operation 608 can be implemented in any manner similar to that described herein, but is not limited to such.

In accordance with the above description, method 600 can produce integrated circuits (e.g., non-volatile memory devices) that include varied silicon richness silicon nitride layers. Note that method 600 may produce one or more potential benefits similar to those described herein, but is not limited to such. Furthermore, method 600 is not limited in any way by those potential benefits.

The foregoing descriptions of various specific embodiments in accordance with the invention have been presented for purposes of illustration and description. They are not intended to be exhaustive or to limit the invention to the precise forms disclosed, and many modifications and variations are possible in light of the above teaching. The invention is to be construed according to the Claims and their equivalents.

What is claimed is:

1. A method comprising:
   forming a tunnel oxide layer on a substrate;
   depositing via a first atomic layer deposition a first non-stoichiometric silicon nitride layer onto said tunnel oxide layer, said first non-stoichiometric silicon nitride layer comprises a first silicon richness value, said depositing comprises using a silicon precursor and a molecular nitrogen purge;
   reducing said first silicon richness value by a predefined amount to produce a second silicon richness value;
   depositing via a second atomic layer deposition a first silicon nitride layer above said first non-stoichiometric silicon nitride layer, said first silicon nitride layer comprises said second silicon richness value;
   reducing said second silicon richness value by another predefined amount to produce a third silicon richness value; and
   depositing via a third atomic layer deposition a second silicon nitride layer above said first silicon nitride layer, said second silicon nitride layer comprises said third silicon richness value.

2. The method of claim 1, wherein said first silicon nitride layer is in contact with said first non-stoichiometric silicon nitride layer.

3. The method of claim 1, wherein said second silicon nitride layer is in contact with said first silicon nitride layer.

4. The method of claim 1, wherein said second silicon nitride layer comprises an upper film of stoichiometric silicon nitride.

5. The method of claim 4, wherein said second silicon nitride layer is in contact with said first silicon nitride layer.

6. The method of claim 1, wherein said forming said tunnel oxide layer comprises using another atomic layer deposition.

7. The method of claim 1, wherein said first non-stoichiometric silicon nitride layer and said first silicon nitride layer are part of a non-volatile memory.

8. The method of claim 1, wherein said using said silicon precursor comprises injecting said silicon precursor for approximately a sixth of a cycle of said first atomic layer deposition.

9. A method comprising:
   forming a tunnel oxide layer on a silicon substrate;
   depositing via a first atomic layer deposition a first non-stoichiometric silicon nitride layer onto said tunnel oxide layer, said first non-stoichiometric silicon nitride layer comprising a first silicon richness value, said depositing comprises using a silicon precursor, a molecular nitrogen purge, and a nitrogen precursor;
   reducing said first silicon richness value by a predefined amount to produce a second silicon richness value;
   depositing via a second atomic layer deposition a first silicon nitride layer above said first non-stoichiometric silicon nitride layer, said first silicon nitride layer comprises an upper film of stoichiometric silicon nitride, said first silicon nitride layer comprising said second silicon richness value;
   reducing said second silicon richness value by another predefined amount to produce a third silicon richness value; and
   depositing via a third atomic layer deposition a second silicon nitride layer above said first silicon nitride layer, said second silicon nitride layer comprises said third silicon richness value.

10. The method of claim 9, further comprising:
    reducing said third silicon richness value by another predefined amount to produce a fourth silicon richness value.

11. The method of claim 9, wherein said using said molecular nitrogen purge comprises performing said molecular nitrogen purge for approximately a third of a cycle of said first atomic layer deposition.

12. The method of claim 9, wherein said first non-stoichiometric silicon nitride layer, said first silicon nitride layer, and said second silicon nitride layer are part of an integrated circuit non-volatile memory.

13. A method comprising:
    forming a tunnel oxide layer on a substrate;
    depositing via a first atomic layer deposition a first non-stoichiometric silicon nitride layer onto said tunnel oxide layer, said first non-stoichiometric silicon nitride layer comprises a first silicon richness value, said depositing comprises using a silicon precursor and a molecular nitrogen purge;
    changing said first silicon richness value by a predefined amount to produce a second silicon richness value;
    depositing via a second atomic layer deposition a first silicon nitride layer above said first non-stoichiometric silicon nitride layer, said first silicon nitride layer comprises said second silicon richness value;
    changing said second silicon richness value by another predefined amount to produce a third Silicon richness value; and
    depositing via a third atomic layer deposition a second silicon nitride layer above said first silicon nitride layer, said second silicon nitride layer comprises said third silicon richness value.

14. The method of claim 13, wherein said first silicon nitride layer is in contact with said first non-stoichiometric silicon nitride layer.

15. The method of claim 13, wherein said second silicon nitride layer is in contact with said first silicon nitride layer.

16. The method of claim 13, wherein said second silicon nitride layer comprises an upper film of stoichiometric silicon nitride.

17. The method of claim 16, wherein said second silicon nitride layer is in contact with said first silicon nitride layer.

18. The method of claim 13, wherein said forming said tunnel oxide layer comprises using another atomic layer deposition.

19. The method of claim 13, wherein said first non-stoichiometric silicon nitride layer and said first silicon nitride layer are part of a non-volatile memory.

20. The method of claim 13, wherein said using said silicon precursor comprises injecting said silicon precursor for approximately a sixth of a cycle of said first atomic layer deposition.

* * * * *